United States Patent [19]
Yamaguchi et al.

[11] 4,115,764
[45] Sep. 19, 1978

[54] DIAGNOSTIC SYSTEM EMPLOYING A MAGNETIC FIELD RESPONSIVE APPARATUS

[75] Inventors: Hiroaki Yamaguchi, Anjo; Hiroshi Fujinami, Okazaki, both of Japan

[73] Assignee: Nippon Soken, Inc., Nishio, Japan

[21] Appl. No.: 758,773

[22] Filed: Jan. 12, 1977

Related U.S. Application Data

[62] Division of Ser. No. 608,239, Aug. 27, 1975, abandoned.

[30] Foreign Application Priority Data

Sep. 27, 1974 [JP] Japan .................. 49/111883

[51] Int. Cl.² ............... G08B 21/00; G01R 19/00; B60Q 1/00
[52] U.S. Cl. ............................. 340/530; 324/102; 324/133; 340/56; 340/664

[58] Field of Search ............... 324/129, 102, 133, 51, 324/54, 117 R, 103 P; 340/253 R, 253 A, 253 P, 56, 52 R; 235/92 EL, 92 CA; 335/32

[56] References Cited

U.S. PATENT DOCUMENTS

| 2,769,056 | 10/1956 | Wallace et al. | 335/32 |
| 3,789,293 | 1/1974 | Freeze | 324/51 |
| 3,823,370 | 7/1974 | Pendleton et al. | 324/54 |
| 3,846,698 | 11/1974 | Lawton | 324/102 |

Primary Examiner—Rudolph V. Rolinec
Assistant Examiner—Ernest F. Karisen
Attorney, Agent, or Firm—Cushman, Darby & Cushman

[57] ABSTRACT

A current detecting apparatus wherein when a wire is energized, a reed switch comes into operation in response to the magnetic lines of force generated concentrically around the wire to detect the presence of a current flow in the wire. The current detecting apparatus may be easily attached on and removed from a wire.

4 Claims, 13 Drawing Figures

DIAGNOSTIC SYSTEM EMPLOYING A MAGNETIC FIELD RESPONSIVE APPARATUS

This is a division, of application Ser. No. 608,239 filed Aug. 27, 1975, now abandoned.

BACKGROUND OF THE INVENTION

1. Field of the Invention

The present invention relates to a current detecting apparatus and more particularly it relates to a current detecting apparatus for detecting the flow of an electric current in the wire of a large current circuit.

2. Description of the Prior Art

Known current detecting apparatus of the above type which have heretofore been proposed include those having the following variety of constructions and these known apparatus have their own disadvantages as will be described hereunder.

(1) One form of such prior art apparatus is constructed so that all the current flowing in a wire is supplied to a coil or part of the current flow is supplied to the coil through a shunt, current transformer or the like to operate the contacts of a relay or the like with the magnetic flux generated by the coil (e.g., current relays). However, the apparatus of the type in which all the current flowing in a wire is supplied to the coil has the disadvantage of making the apparatus bulky in construction. Further, the apparatus of the other type employing a shunt or current transformer is disadvantageous in that the apparatus is expensive to manufacture and there are instances where an additional connecting operation is required. Further, with the latter type of apparatus employing a current transformer, the detection of DC current is impossible unless a specially designed DC current transformer is used.

(2) In other form of the known apparatus, the magnetic lines of force which are generated by the current flowing in a wire are passed to a Hall device and the detection of current is made according to the Hall voltage of the Hall device. While the apparatus of this construction has been put into practical applications as a DC current transformer, etc., the apparatus of this type has the disadvantage of high manufacturing cost since it requires a current regulating device for energizing the Hall device. Current detecting apparatus of the similar construction are also known in the art in which a magnetic induction device is employed in place of a Hall device. A disadvantage of this type of apparatus is that since current is detected in accordance with variation in the resistance of the magnetic induction device, it is necessary to use a transistorized detector and current regulating device thus making the apparatus expensive to manufacture and complicated in construction.

Therefore, there has existed a need for an improved apparatus of the above type which is capable of detecting the flow of current in a wire with a very simple construction. Specifically, there has existed a need for an improved current detecting apparatus of the portable type which is simple to operate and easy to attach on and remove from a wire without any need for connecting a shunt or the like to the wire.

SUMMARY OF THE INVENTION

It is an object of the present invention to provide a current detecting apparatus which is capable of detecting an electric current in a wire with a very simple construction, is inexpensive to manufacture, requires no operaion of cutting and connecting the wire to any device and is easy to operate.

It is another object of the present invention to provide a current detecting apparatus employing a reed switch.

The apparatus provided in accordance with the present invention has among its great advantages the fact that on the basis of the recognition that a reed switch has very important properties, namely it is responsive to very small magnetic lines of force and is simple in construction and that is is the nature of a wire to generate magnetic lines of force therearound when current is supplied to the wire, a reed switch is operated by the magnetic lines of force generated concentrically around a wire when current is supplied to the wire thus permitting the detection of current flow in the wire with a very simple construction.

DESCRIPTION OF THE PREFERRED EMBODIMENTS

Figure 1:
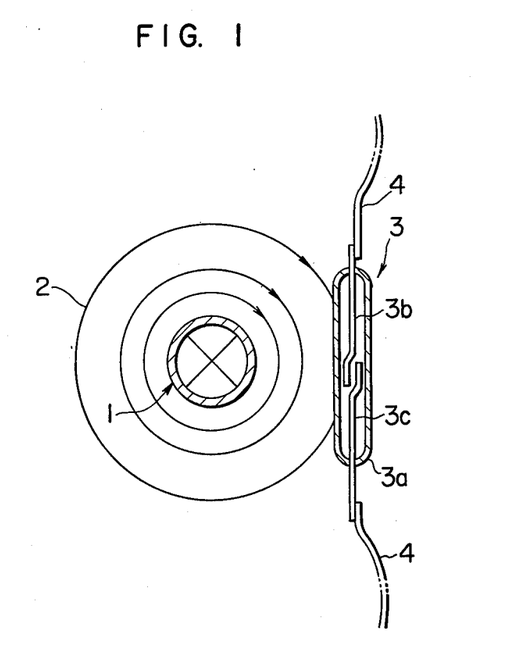
FIG. 1 is a schematic view useful in explaining the principle of a current detecting apparatus according to the present invention.
Figure 2A:
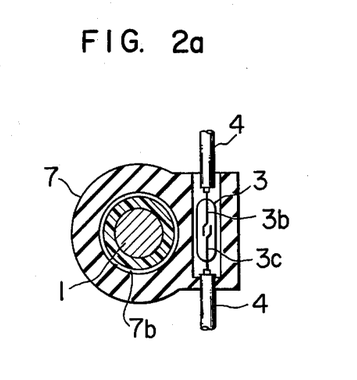
FIGS. 2a and 2b are respectively a front view and a side view of an embodiment of the current detecting apparatus according to the invention.
Figure 2B:
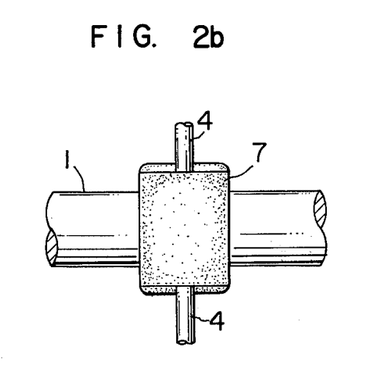
Figure 3:
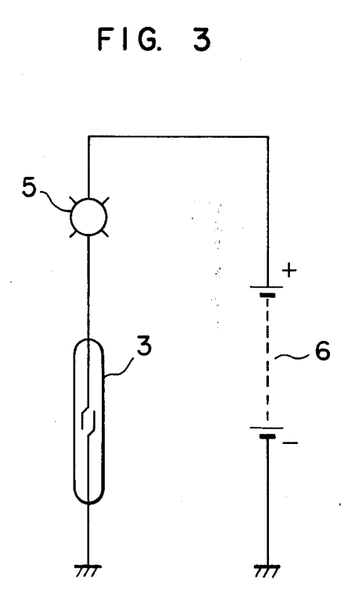
FIG. 3 is a circuit diagram of a warning system incorporating the current detecting apparatus of this invention.

Referring now to FIGS. 1 to 3, numeral 1 designates a wire connected from a power source to a load, 2 the magnetic lines of force generated by the current flowing in the wire 1, 3 a reed switch disposed in the vicinity of the wire 1 with the central axis of the reed switch 3 making an angle of about 90° with that of the wire 1. A pair of movable electrodes 3b and 3c which are made of magnetic material are arranged in the opposite positions in the inside of the cylindrical tube of the reed switch 3. Numeral 4 designates a signal line connected to the movable electrodes 3b and 3c, 5 (FIG. 3) a lamp connected to the signal line 4, 6 (FIG. 3) a battery, 7 a clamp member containing the reed switch 3 and detachably attached on the wire 1. The clamp member 7 is for example made of rubber or plastic material.

The above-described embodiment of the current detecting apparatus according to the invention operates as follows. When current flows in the wire 1, a magnetic field is generated around the wire 1 according to the Ampere's right-handed screw rule and magnetic lines of force 2 concentrically encircle the wire 1. Since the reed switch 3 is placed in the path of the magnetic lines of force 2, the movable electrodes 3b and 3c are closed in response to the magnetic lines of force 2. When this occurs, the current flows through the battery 6, the lamp 5, the signal line 4 and the reed switch 3 and the lamp 5 lights (FIG. 3). In other words, when the current flow in the wire 1 reaches a predetermined value, the magnetic lines of force 2 generated by the current cause the lamp 5 to go on to indicate that the current is flowing in the wire 1. Any other warning device such as a buzzer may be used in place of the lamp 5. Further, in order to dispose a reed switch adjacent to the wire, an adhesive tape may be used as a mounting member for attaching the reed switch to the side wall of another member, for example, of an automotive body adjacent to the wire. Further, the mounting member may be, for example, a plastic case of the portable type at one end of which the reed switch is fixed and at the other end of which a handle is provided, so that the reed switch at the end of the plastic case can come near to the wire to detect a current flow therein by a lamp or relay provided in the plastic case or another place.

Figure 4:
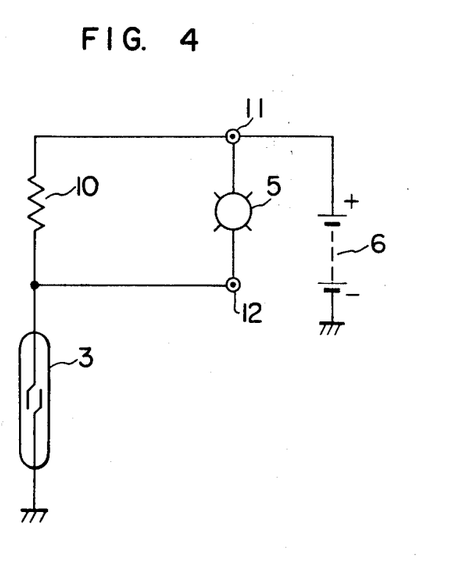
FIG. 4 is a circuit diagram of another warning system incorporating the apparatus of this invention.
Figure 5:
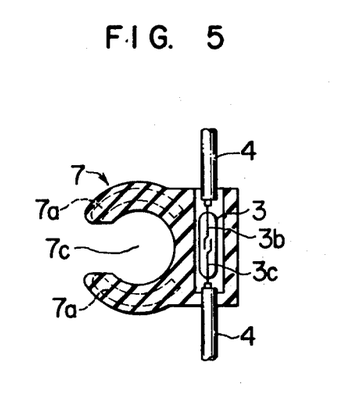
FIG. 5 is a front view of another embodiment of the current detecting apparatus of this invention.

Further, it is a matter of course that an output signal may be delivered from output terminals 11 and 12 which are connected to the ends of a resistor 10 connected in series with the reed switch 3 as shown in FIG. 4. Moreover, one end of the clamp member 7 may be opened to form a slot 7c as shown in FIG. 5 and in this way it is possible to provide a portable current detecting apparatus which may be attached on and removed from the wire 1 as desired. Still furthermore, iron cores 7a may be embedded in the clamp member 7 as shown by the dotted lines in FIG. 5 to provide a path for the magnetic lines of force 2 and to thereby operate the reed switch 3 with an improved sensitiveness, while on the other hand a plurality of wires may be inserted into the central portion of the clamp member 7 or alternately the same wire may be wound several times around the clamp member 7 to pass the wire several times through the central portion of the clamp member 7.

It will thus be seen from the foregoing description that the current detecting apparatus provided in accordance with the present invention, by virtue of the use of the reed switch 3, has no need to connect the wire 1 to a coil or wind an electromagnetic coil around the wire 1 as is the case where a current transformer is used and thus the apparatus is very simple in construction and easy to operate. In addition, either an AC current or DC current may be supplied to the wire 1.

Next, some use applications of the apparatus according to the invention will be described. Since the apparatus of this invention is simple and inexpensive to manufacture, the apparatus has a wide range of applications and it may be used in the detection of current in applications where the conventional apparatus cannot be used for economical reasons. Specific forms of these applications will now be described.

Figure 6:
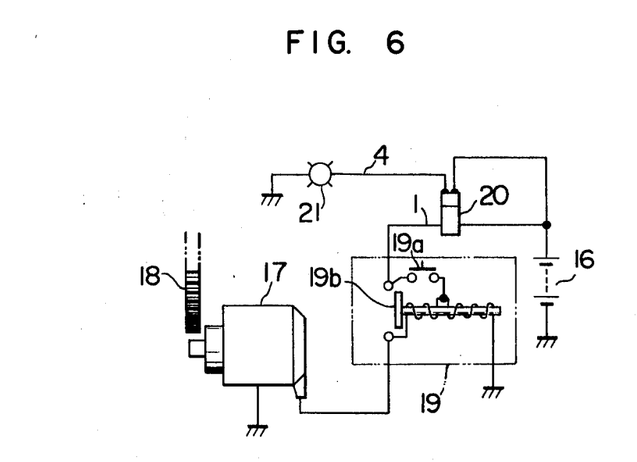
FIG. 6 is a circuit diagram of an automobile starter current draw indicating system incorporating the apparatus of this invention.

(1) Referring to FIG. 6 showing an application of the apparatus of the invention in which the apparatus is incorporated in a starter current draw indicating system for vehicles, particularly automobiles, numeral 16 designates a battery installed in an automobile, 17 a starter for turning a ring gear 18 connected to the engine of the automobile, 19 a control circuit for the starter 17 which comprises a starter switch 19a and a magnet switch 19b. Numeral 20 designates the current detecting apparatus according to the invention, 21 a lamp connected to the signal line 4 of the current detecting apparatus 20. The starter current draw indicating system just described operates as follows. When the starter switch 19a is closed so that the magnet switch 19b is closed, the starter 17 is energized and the starter 17 starts rotating to supply a large starting current to the wire 1. If, at this time, the battery 16 and the starter 17 are functioning properly and if there is no leakage or the like in the circuit and there is thus the normal current draw in the wire 1, the lamp 21 is lighted through the current detecting apparatus 20 to inform the driver that the starter 17 itself is functioning properly. On the contrary, if the starting current is lower than the normal current draw due to a leakage or any fault in the starter 17, the resulting magnetic field generated around the wire 1 is insufficient for closing the reed switch 3 in the current detecting apparatus 20 and therefore the lamp 21 is not lighted. Consequently, in case of failure to start the engine, the driver can determine whether the failure to start is due to any fault in the engine or the starter current draw indicating system and the driver can take the most appropriate corrective measure accordingly.

On the other hand, if the lamp 21 is lighted when the starter 17 is not in operation, the driver can know that there is an abnormal current flow due to a leakage or a short-circuit in the starter 17. Of course, any other warning device such as a buzzer may be used in place of the lamp 21.

Figure 7:
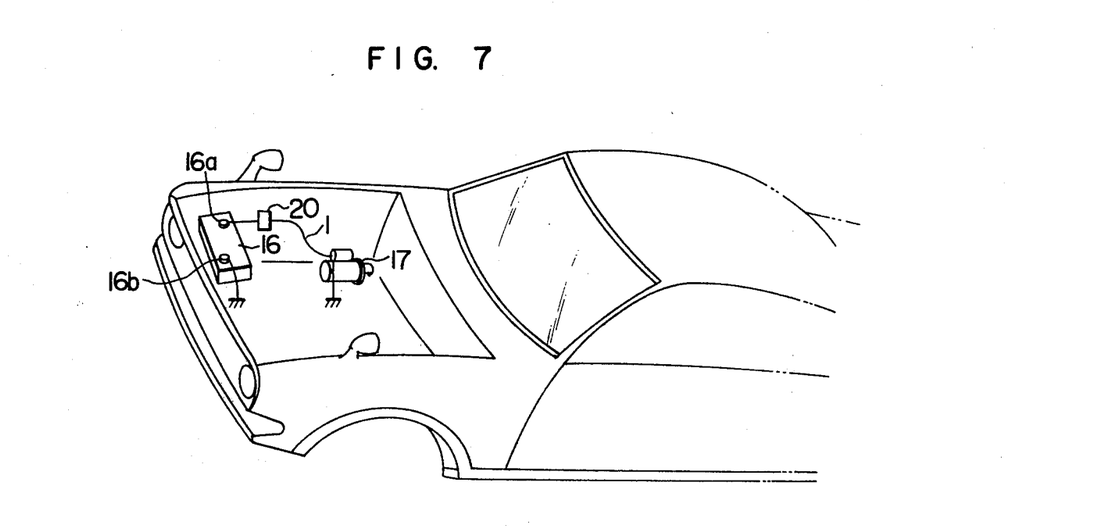
FIG. 7 is a schematic view showing the condition in which the apparatus of this invention is installed in the engine room of an automobile.

FIG. 7 shows the location of the current detecting apparatus in the above-described application of FIG. 6. In the engine room shown in FIG. 7, numeral 16 designates the battery having a positive terminal 16a and a negative terminal 16b, 17 the starter which is energized for starting the engine with the positive supply terminal of the starter 17 connected to the battery positive terminal 16a through the wire 1. The battery negative terminal 16b and the starter negative terminal are grounded to the vehicle body. Numeral 20 designates the current detecting apparatus attached on the wire 1 in the vicinity of the positive terminal 16a of the battery 16, namely, the current detecting apparatus 20 is located near the battery positive terminal 16a (more particularly, it is located about 100 mm apart from the battery positive terminal 16a) in order to prevent erroneous operation of the current detecting apparatus 20 due to the effects of the magnetism generated by the alternator, the starter, etc. The current detecting apparatus 20 needs not be fixedly mounted on the vehicle body due to its light weight.

Figure 8:
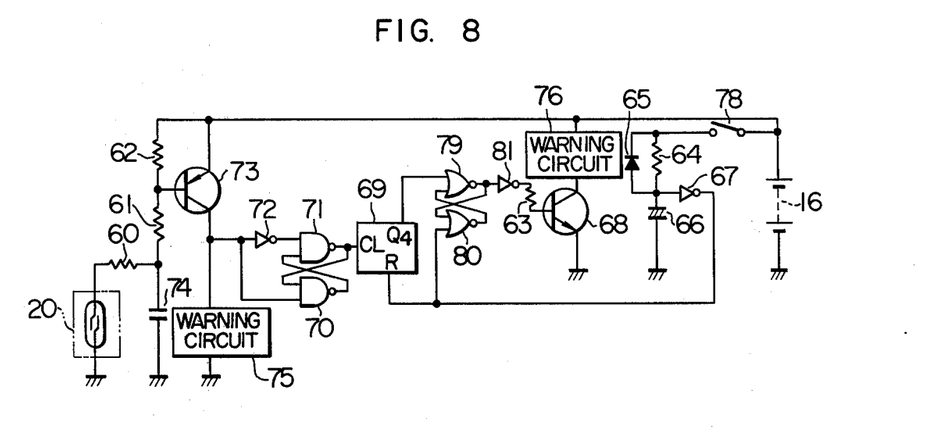
FIG. 8 is a circuit diagram of an automobile drive line diagnostic system incorporating the apparatus of this invention.

(2) Another application of the apparatus of the invention as incorporated in a current draw indicating system for the wiper motor, blower motor, starter, etc. of an automobile will now be described particularly in reference to a starter current draw indicating system. Referring to FIGS. 7 and 8, numeral 20 designates a current detecting apparatus mounted as shown in FIG. 7, 60, 61, 62 and 63 resistors, 74 a chattering preventive capacitor, 73 a transistor having its base connected to the junction point of the resistors 62 and 61, its emitter connected to a supply line and its collector connected to one end of a warning load or circuit 75. The transistor 73 is also connected through its collector to the input of an inverter gate 72 and one input of an NAND gate 70, and the output of the inverter gate 72 is connected to one input of an NAND gate 71. The outputs of the AND gates 71 and 70 are connected to the other inputs of their partners, and a reshaping circuit is constituted by the inverter gate 72 and the NAND gates 71 and 70. The output of the NAND gate 71 is connected to the clock input terminal of a counter circuit 69 whose output $Q_4$ is connected to the base of a transistor 68 through a set-reset flip-flop comprising NOR gates 79 and 80, an inverter gate 81 and the resistor 63. The transistor 68 has its collector connected to a power source through a warning circuit 76 and its emitter connected to the ground. A resistor 64 and a capacitor 66 constitute a CR charging circuit, and a diode 65 is a quick discharging diode for the charge stored in the capacitor 66. The junction point of the resistor 64, the diode 65 and the capacitor 66 are connected to the input of an inverter gate 67 whose output (reset signal) is applied to a reset input terminal R of the counter circuit 69 and the input of the NOR gate 80. One ends of the capacitors 66 and 74, the current detecting apparatus 20 including the reed switch and the warning circuit 75 are grounded. Numeral 16 designates a battery, 78 an ignition switch.

With the construction described above, the operation of the system is as follows. When the power from the battery 16 is switched on, the power is supplied to all the circuits except the diode 65, the resistor 64 and the capacitor 66. At this time, since the input of the inverter gate 67 is at the ground potential, the output of the inverter gate 67 goes to the supply voltage (hereinafter referred to as an "H" level) and the counter circuit 69 is reset. Thereafter, when the ignition switch 78 is closed so that the starter 17 (not shown in FIG. 8) starts rotating, the capacitor 66 stores charge through the resistor 64 and eventually the output of the inverter gate 67 goes to an "L " level thus placing the counter circuit 69 in condition for counting operation. Since the ignition switch 78 is in the closed position, the starter 17 is energized by the battery 16. Consequently, under normal conditions where there is a sufficient current flow for operating the starter 17, the reed switch of the current detecting apparatus 20 is closed. In this case, since the resistors 60, 61 and 62 are connected in series with the current detecting apparatus 20, the voltage across the resistor 62 applies a forward bias between the base and emitter of the transistor 73 and the transistor 73 is turned on. When this occurs, the warning circuit 75 generates a signal indicating that the starter is operating properly (e.g., a green lamp is turned on). On the contrary, under faulty conditions where the amount of starter current is insufficient, the current detecting apparatus 20 is not closed with the result that the transistor 73 is turned off and the warning circuit 75 generates no signal. Where the starter current is not stable (e.g., due to variations in the load or the battery voltage dropping to the starter operating threshold), the reed switch of the current detecting apparatus 20 cannot remain stably in the closed position and the reed switch is repeatedly turned on and off in synchronism with the instable starter current. Consequently, the resulting ON and OFF signals are applied to the input of the inverter 72, reshaped by the gates 70, 71 and 72 and applied to the counter circuit 69. When the counter circuit 69 counts a preset number of pulses (16 pulses in the present case), its output $Q_4$ goes to the "H" level so that since the input of the NOR gate 80 is at the "L" level, the S-R flip-flop changes its state and the output of the inverter 81 remains at the "H" level. As a result, the transistor 68 is turned on and a warning circuit (for lighting a red lamp, for example) generates a signal to indicate an irregularity. Namely, where the starter current is inadequate to operate the starter, none of the warning circuits 76 and 75 generates an output signal.

On the other hand, where the battery voltage has dropped to the starter operating threshold, the warning circuit 75 intermittently gives a warning only when the reed switch is on and the warning circuit 76 cones into operation when the count of the counter circuit 69 exceeds 16. When the starter current is sufficient for operating the starter, the warning circuit 75 (for lighting a green lamp, for example) operates continuously so far as the ignition switch 78 is in the closed position.

By using the same circuit construction as described above, the locked condition and overload condition of a wiper motor, blower motor or the like may be detected. For example, to use the system shown in FIG. 8, it is necessary to replace the ignition switch 78 with a motor starting switch. In operation, the time constant depending on the resistor 64 and the capacitor 66 is determined to preselect a CR time constant which is sufficiently long so that the counter circuit 69 is reset to prevent its counting operation for the duration of the inrush current during the motor starting period. During normal operation of the motor, the current flow is insufficient for closing the reed switch of the current detecting apparatus 20 and none of the warning circuits 75 and 76 comes into operation. On the other hand, under overload or locked condition, a large current flows to the motor and the reed switch is closed. In the locked condition, the warning circuit 75 operates continuously and the warning circuit 76 remains inoperative, whereas in the overload condition, in the similar manner as was the case when the battery voltage dropped to the starter operating threshold as mentioned previously, the warning circuit 75 operates intermittently and the warning circuit 76 comes into continuous operation in response to the counting of 16 pulses. In this way, any excessive current flow in a wiper motor, blower motor or the like may be detected to take a proper countermeasure in good time and thereby to prevent any serious trouble such as the burning of the motor. It is of course possible to design so that the motor is automatically disconnected from the power source by means of the relay in the warning circuit. Further, by using the current detecting apparatus 20 of the detachable construction of FIG. 5 in the system shown in FIG. 8 and by thus using the apparatus 20 as a handy device instead of mounting it on the body portion of an automobile, it is possible to provide a diagnostic system which is easy to operate for making a diagnosis of the driving system of automobiles in a service shop or the like. The operation of such a diagnostic system is the same with the previously described indicating systems. However, the battery 16 may either be an automobile battery or a small dry cell unit, and it is also necessary to replace the ignition switch 78 with a battery switch.

(3) With heavy current circuits used in factories, ships, large equipment, etc., it is essential to indicate on a graphic panel whether current is presently flowing in a wire such as an electric wire or bus bar, to bring a safety device into operation or to supply a signal indicating the presence of current flow to the sequence circuit of a control panel. The current detecting apparatus of this invention may be used with such heavy current circuits.

Figure 9:
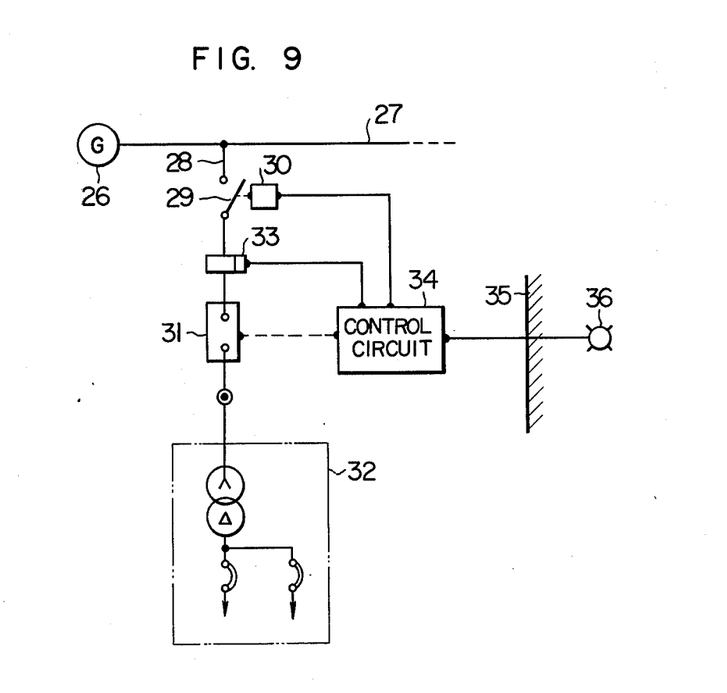
FIG. 9 is a skeleton circuit diagram of a heavy current circuit service entrance system incorporating the apparatus of the invention.

One specific form of such applications will now be described with reference to FIG. 9. In the skeleton system diagram of FIG. 9, numeral 26 designates a power source such as a generator, 27 a bus bar, 28 a feeder line branched from the bus bar 27, 29 a disconnecting switch, 30 a locking device for the disconnecting switch 29, 31 an oil circuit breaker, 32 a large capacity load, 33 a current detecting apparatus, 34 a control circuit, 35 a partition wall indicating a separate place, 36 a lamp on a graphic panel. In the service equipment of this heavy current circuit, it is essential to disconnect the load 32 from the feeder line 28 through the oil circuit breaker 31 before closing or opening the disconnecting switch 29. If the disconnecting switch 29 is operated with the oil circuit breaker 31 closed and the load current flowing in the feeder line 28, it results in a serious trouble such as the burning or short-circuiting of the disconnecting switch 29 due to its low interrupting capacity. Consequently, an interlock circuit is provided in the control circuit 34 by means of the auxiliary contacts operatively associated with the main contacts of the oil circuit breaker 31, so that when the oil circuit breaker 31 is closed, the electromagnetic coil of the locking device 30 associated with the disconnecting switch 29 is energized to prevent the movement of the blade of the disconnecting switch 29. In this case, the auxiliary contacts are not completely reliable and moreover if the oil circuit breaker 31 is not installed in the same switchboard but located at a distant place, this gives rise to a wiring difficulty. However, since the current detecting apparatus 33 of this invention is attached on the feeder line 28 and its output is connected to the control circuit 34 as shown in FIG. 9, when there is a current flow in the feeder line 28, a signal is applied to the locking device 30 of the disconnecting switch 29 to render the latter inoperative and the presence of current flow in the feeder line 28 is indicated by means of the lamp 36 on the graphic panel located at the separate place. Of course, the output signal of the auxiliary contacts of the oil circuit breaker 31 may be coupled to the control circuit 34 as shown by the broken line to provide an additional safety circuit and ensure a greater operating accuracy.

Figure 10:
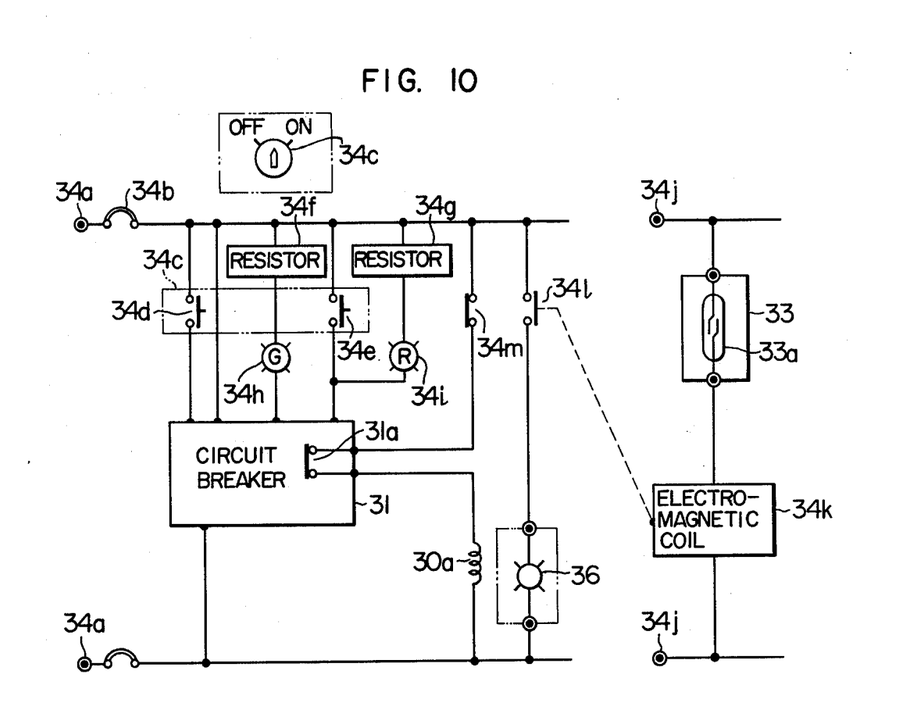
FIG. 10 is a circuit diagram for the control circuit of the system shown in FIG. 9.

The control circuit 34 of the above-mentioned system will be described in greater detail with reference to the circuit diagram of FIG. 10. In FIG. 10, numeral 34a designates the input terminal of the control circuit 34 to which is applied a single-phase control supply voltage of 100 volts, 34b a no-fuse circuit breaker for protecting the control circuit 34 against short-circuiting, 31 the oil circuit breaker of a type which is commercially available, 34c a change-over switch for controlling the closing operation of the oil circuit breaker 31 including contacts 34d which close when the switch closes and another contacts 34e which close when the switch opens. Numerals 34f and 34g designate resistors, 34h and 34i lamps for respectively indicating the open and closed conditions of the oil circuit breaker 31, 34j an input terminal for receiving a DC power supply of 24 volts, 33a the reed switch in the current detecting apparatus 33, 34k the coil of a DC relay having contacts 34l and 34m which are respectively closed and opened in response to the closing of the reed switch 33a. Numeral 36 designates the indicator lamp mounted on the graphic panel located in the distance, 31a the auxiliary contacts disposed in the oil circuit breaker 31 to open in response to the closing of the high-voltage main contacts of the oil circuit breaker 31, 30a the electromagnetic coil of the locking device 30 for preventing the movement of the blade of the disconnecting switch 29, which is an accessory of the commercially available disconnecting switches.

With the construction described above, by placing the change-over switch 34c either in the open position or the closed position, the main contacts of the oil circuit breaker 31 are closed or opened and the operating conditions of the oil circuit breaker 31 are indicated by the lamps 34h and 34i. When the oil circuit breaker 31 is closed and there is a flow of high-voltage load current higher than a predetermined value, the reed switch 33a of the current detecting apparatus 33 is closed and the coil 34k is energized thus closing the contacts 34l and lighting the graphic lamp 36 to indicate that the current has been switched on. At this time, since the contacts 34m are opened and the auxiliary contacts 31a are also opened, the electromagnetic coil 30a is not energized and the disconnecting switch 29 remains inoperative. On the other hand, when the oil circuit breaker 31 is closed so that the high-voltage load current is stopped, the reed switch 33a opens and both the contacts 34m and the auxiliary contacts 31a are closed thus allowing the movement of the blade of the disconnecting switch 29.

Figure 11:
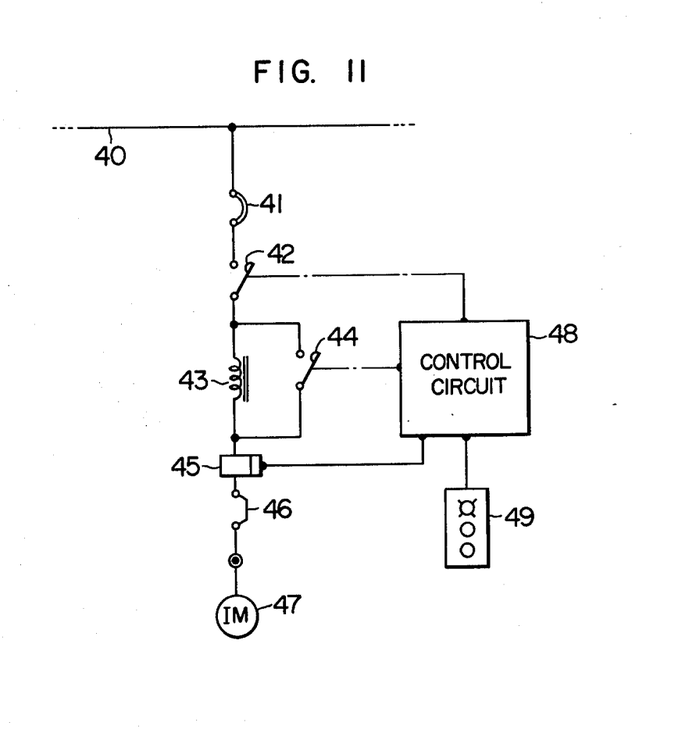
FIG. 11 is a skeleton circuit diagram of a reactor-type motor starter employing the apparatus of the invention.

In addition to these applications, the current detecting apparatus of this invention may be used in the detection of current flow in the starting circuit of a motor during the reactor starting, star-delta starting, compensated starting or the like. For example, in FIG. 11 showing a circuit diagram of a reactor-type starter employing the current detecting apparatus of this invention, numeral 40 designates a bus bar, 41 a distributing circuit breaker, 43 a main electromagnetic switch, 43 a starting reactor, 44 a short-circuiting electromagnetic switch, 45 a current detecting apparatus, 46 a thermal relay, 47 an induction motor, 48 a control circuit for controlling the motor circuit, 49 a push button switch box.

With the construction described above, when a motor starting instruction is generated from the push button switch 49, the main electromagnetic switch 42 is closed through the control circuit 48 and a restricted starting current flows to the induction motor 47 from the bus bar 40 through the starting reactor 43 causing the induction motor 47 to start rotating. At this time, the reed switch of the current detecting apparatus 45 is closed by the magnetic lines of forces generated by the starting current and the short-circuiting electromagnetic switch 44 is opened by the control circuit 48. When the speed of the induction motor 47 increases so that the starting current decreases and becomes steady at a value lower than a predetermined value, the reed switch of the current detecting apparatus 45 is no longer allowed to remain closed and it is thus opened.

In response to the opening of the reed switch, the control circuit 48 closes the short-circuiting electromagnetic switch 44 to short-circuit the starting reactor 43 and the full voltage of the power supply is applied to the induction motor 47 thus completing the starting operation.

Figure 12:
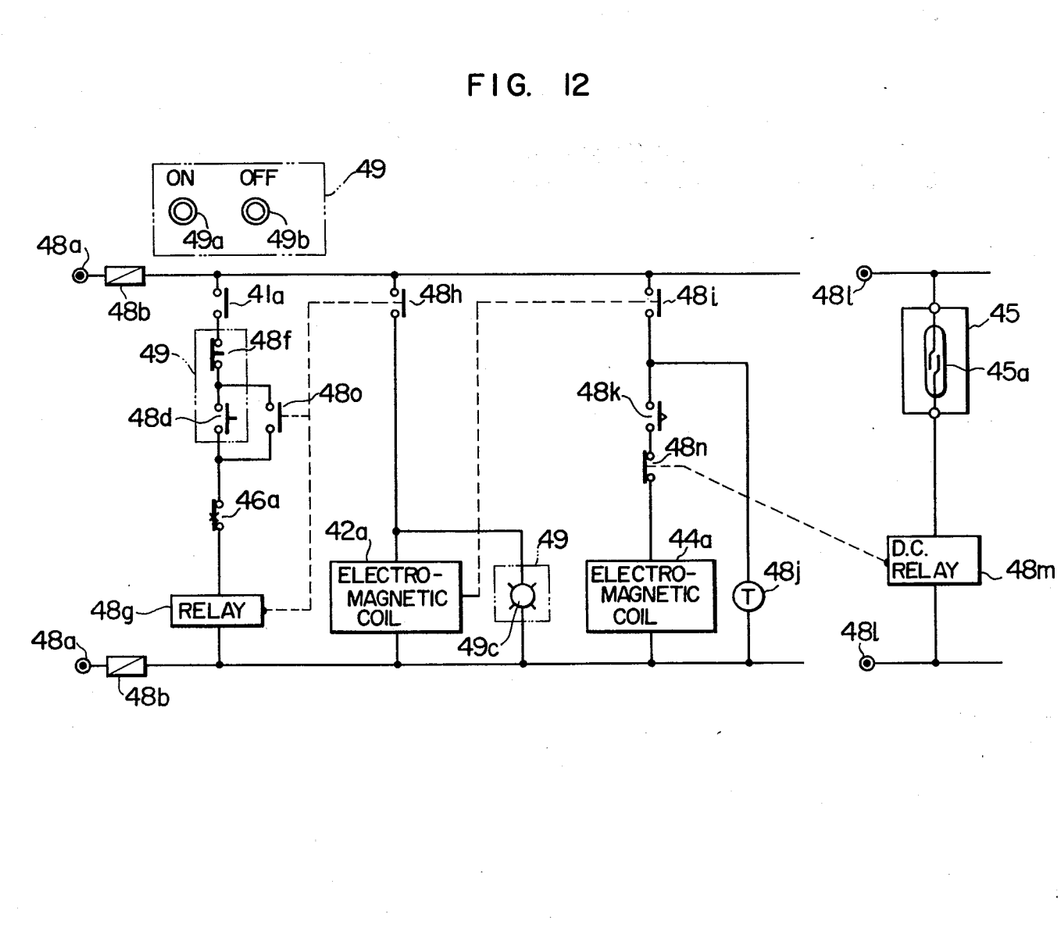
FIG. 12 is a circuit diagram for the control circuit of the reactor-type starter shown in FIG. 11.

The control circuit 48 of the above-described system will now be described in greater detail with reference to FIG. 12. In FIG. 12, reference numeral 48a designates the input terminal of the control circuit 48 to which is applied a single-phase control power supply of 100 volts, 48b a fuse, 49a a motor starting switch in the push button switch box 49 whereby contacts 48d close in response to the depression of the switch 49a and they open in response to the releasing of the switch 49a. Numeral 49b designates a motor stopping switch which is depressed to open contacts 48f and which is released to restore the contacts 48f into the initial position, 41a the auxiliary contacts of the distributing circuit breaker 41, 46a the contacts of the thermal relay 46 for providing overload protection, 48g a relay coil for moving contacts 48h and 48o, 42a the electromagnetic coil of the main electromagnetic switch 42, 49c the lamp on the push button switch box 49, 48i auxiliary contacts moved by the electromagnetic coil 42a, 48j a timer, 48k the time limit contacts of the timer 48j, 44a the electromagnetic coil of the short-circuiting electromagnetic switch 44, 48l an input terminal for receiving a DC power supply of 24 volts, 45a the reed switch of the current detecting apparatus 45, 48n contacts which are moved by the coil 48m.

With the system described above, when the starting switch 49a is depressed after the distributing circuit breaker 41 has been closed to close the auxiliary contacts 41a, the contacts 48d are closed and the relay coil 48g is energized to close the contacts 48o and complete a holding circuit. Consequently, the contacts 48h are closed and the electromagnetic coil 42a is energized thus closing the main electromagnetic switch 42 and lighting the lamp 49c. Simultaneously, the contacts 48i are closed, but due to the fact that there is no flow of starting current at this instant, the reed switch 45a is open and, while the contacts 48n are closed due to the deenergization of the coil 48m, the time limit contacts 48k are open thus maintaining the short-circuiting electromagnetic switch 44 in the open position. Thereafter, as the starting current starts flowing, the reed switch 45a closes and the coil 48m is energized to open the contacts 48n. Then, the timer 48j completes its count (the timer is preset to about 2 seconds) and the time limit contacts 48k close. When the starting current eventually becomes steady at a value lower than a predetermined value, the reed switch 45a is no longer allowed to remain closed and the reed switch 45a opens thus deenergizing the coil 48m and closing the contacts 48n. Consequently, the electromagnetic coil 44a is energized and the short-circuiting electromagnetic switch 44 is closed, thus applying the full voltage to the induction motor 47 and completing the starting of the motor.

In a known motor starting system of the above type, the closing of a short-circuiting switch is accomplished by a timer after a preset time and thus the system is not fully reliable in operation. While there is a more sophisticated system of the above type which incorporates a current transformer and a current detector (e.g., a current relay) employing a transistor or the like is provided on the secondary side of the current transformer to detect a current flow, this system also has the disadvantage of high manufacturing cost. With the current detecting apparatus of this invention, however, it is possible to provide a motor starting circuit which is reliable in operation and inexpensive to manufacture. In addition to the applications mentioned above, the current detecting apparatus of this invention may be used in such applications as the detection of short-circuit current in an electric circuit, the detection of overload current in a motor circuit and the detection of overload on a transformer. Particularly in the case of transformers, a colored tape which changes its color when subjected to an excessive heat has heretofore been attached on the outer frame of a transformer as a simple means of detecting an overload on the transformer. With the apparatus according to the invention, however, it is possible to provide a system which is inexpensive and more reliable in protecting transformers against overloading.

We claim:

1. A current detecting apparatus comprising:
    a switch for energizing an electric load through a wire;
    a mounting member attachable on said wire;
    a reed switch fixedly mounted in said mounting member in such a manner that the longitudinal dimension of said reed switch extends substantially perpendicular to the direction of flow of current in the portion of said wire where said mounting member is attached;
    first warning means connected to said reed switch for giving a warning indicative of a sufficient current in said wire, the warning of said first warning means being synchronized with either one of opening and closing operations of said reed switch;
    a counter circuit connected to said reed switch, responsive to the closing of said switch, for counting the number of opening and closing operations of said reed switch and generating an alarm signal when a preset count is reached;
    second warning means connected to said counter circuit for giving a warning in response to said alarm signal, the warning of said second warning means being maintained irrespective of opening and closing operations of said reed switch; and
    a timer circuit connected to said switch and said counter circuit for delaying the initiation of the counting operation of said counter circuit a predetermined period after said wire is energized by the closing of said switch.

2. A current detecting apparatus according to claim 1, wherein said timer circuit includes:
    a resistor connected in series with said switch;
    a capacitor connected in series with said resistor to be charged through said resistor in response to the closing of said switch, said capacitor producing a voltage thereacross which increases at a predetermined time constant; and
    a logic gate connected to said capacitor for producing a reset signal while said voltage is below a predetermined voltage level, said reset signal being applied to said counter circuit for resetting the same.

3. A current detecting apparatus according to claim 2, wherein said timer circuit further includes:
    a diode connected in parallel with said resistor for quickly discharging said capacitor therethrough in response to the opening of said switch.

4. A current detecting apparatus according to claim 3, wherein said second warning means includes:
    a flip-flop circuit connected to be set by said alarm signal produced by said counter circuit for maintaining said alarm signal and to be reset by said reset signal produced by said timer circuit.

* * * * *